United States Patent [19]

Fry

[11] 4,238,811

[45] Dec. 9, 1980

[54] THREE PHASE UNDERVOLTAGE MONITOR

[75] Inventor: Warren C. Fry, Connellsville, Pa.

[73] Assignee: General Equipment & Mfg. Co., Inc., Louisville, Ky.

[21] Appl. No.: 28,558

[22] Filed: Apr. 9, 1979

[51] Int. Cl.³ ............................................. H02H 3/24
[52] U.S. Cl. ................................. 361/92; 307/130; 340/663; 361/187
[58] Field of Search ............................. 361/90, 92, 187; 340/661, 663; 307/130, 362, 363, 364

[56] References Cited

U.S. PATENT DOCUMENTS

| | | | |
|---|---|---|---|
| 3,112,431 | 11/1963 | Pederson | 361/187 |
| 3,300,689 | 1/1967 | Beddoes | 361/187 |
| 3,493,816 | 2/1970 | Monigal et al. | 361/92 |
| 4,137,557 | 1/1979 | Ciarniello et al. | 361/92 |

FOREIGN PATENT DOCUMENTS 971227  7/1975  Canada ...................................... 361/92

Primary Examiner—Harry E. Moose, Jr.
Attorney, Agent, or Firm—Maynard C. Yeasting

[57] ABSTRACT

A three phase undervoltage monitor separately converts the voltage on each phase to a D.C. voltage, compares each of the separate D.C. voltages with a reference voltage, and operates an output signal whenever one or more of the voltages drops below the reference voltage.

3 Claims, 1 Drawing Figure

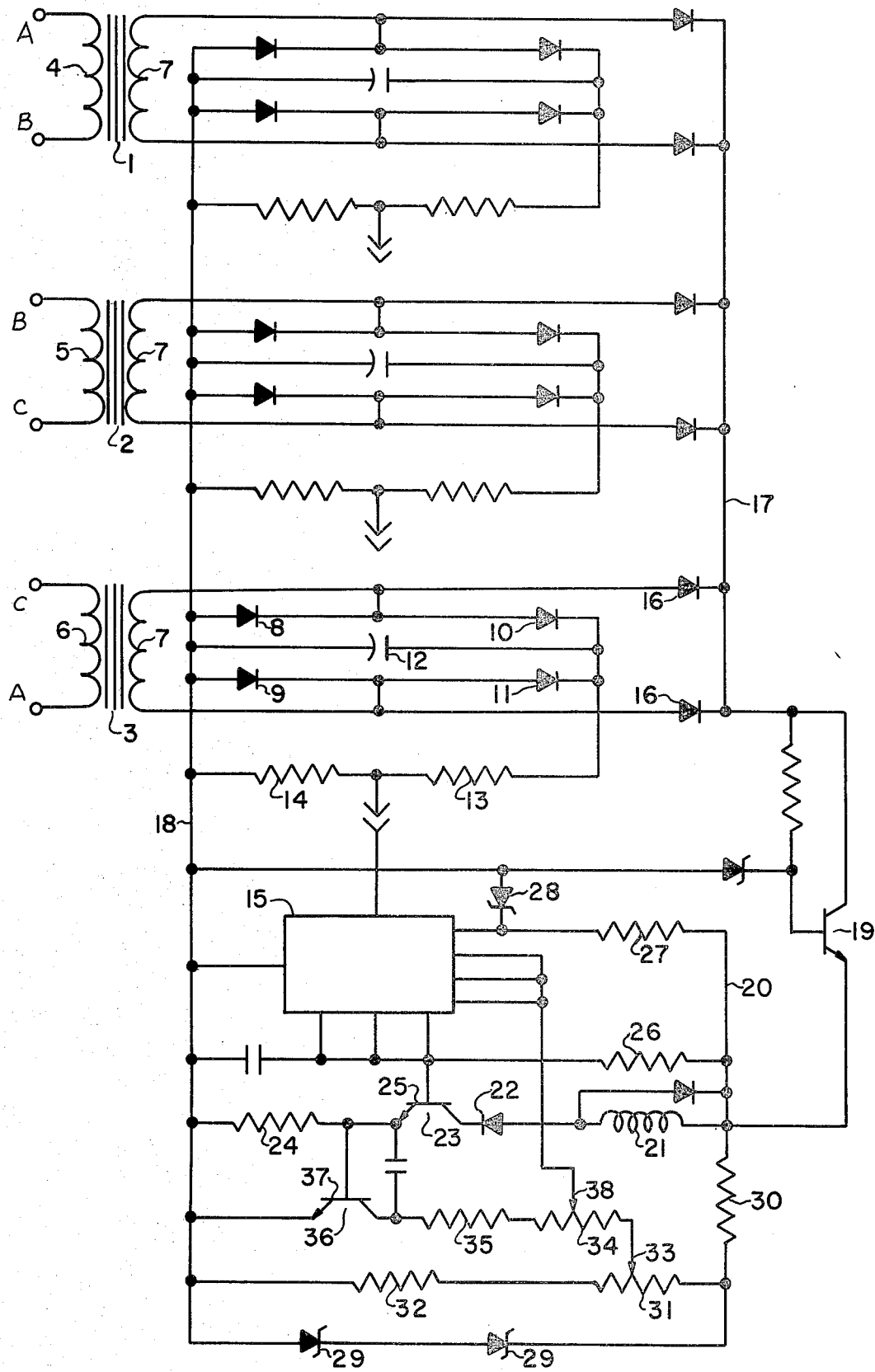

THREE PHASE UNDERVOLTAGE MONITOR

BACKGROUND OF THE INVENTION

Since the performance of most types of electrical equipment is adversely affected by low supply voltage it is desirable to monitor the voltage on the lines supplying electrical power and operate a signal or alarm whenever the voltage falls below a low limit. Existing monitoring equipment is either expensive or of insufficient accuracy or is incapable of identifying the low voltage phase.

SUMMARY OF THE INVENTION

According to the invention, the A.C. line voltages to be monitored are rectified and compared in sensitive comparators, one for each line voltage, with a precise reference voltage. To remember a low line voltage occurence the reference voltage is increased a substantial amount whenever a comparator senses a low voltage. This causes the circuit to "lock in" and continue to indicate a low line voltage condition until reset or until all of the line voltages have returned to normal. Adjustments are provided to set the low voltage limit to which the circuit responds and the voltage at which the circuit resets.

BRIEF DESCRIPTION OF THE DRAWING

In the drawing:

The single FIGURE is a schematic diagram of a multiphase low voltage monitor that operates according to the invention.

DESCRIPTION OF A PREFERRED EMBODIMENT

Referring to the drawing, a three phase monitor, representative of a multiphase monitor, comprises three input transformers 1, 2, 3 having primary windings connected to the power lines A, B, C that are to be monitored. The first transformer 1 has its primary 4 connected to lines A and B. The second transformer 2 has it primary 5 connected to lines B and C while the third transformer has it primary 6 connected to lines C and A.

Each of the transformers has a secondary 7 feeding a full wave bridge rectifier comprising diodes 8, 9, 10, and 11. Each rectifier charges a condenser 12 to a voltage proportional to the line voltage applied to the corresponding transformer primary. A fraction of the voltage on each condenser 12, determined by resistors 13, 14 is applied to the input of a voltage comparator included in a quad comparator 15 such as a National Lm339 integrated circuit.

The rectifiers, through diodes 16, energize a lead 17 constituting a positive power lead for the control circuits. The return from the control circuits is through a lead 18. The lead 17, through a series regulator comprising a "pass" transistor 19 supplies a first regulated voltage lead 20. A coil 21 of an output signal relay is energized by current flowing from the lead 20 through the coil 21, a light emitting diode 22, a transistor 23, and a resistor 24 to the return lead 18. A base 25 of the transistor 23 is biased positive by current flowing through a resistor 26 from the lead 20. The current flow is shunted away from the base 25 and through an output circuit of a comparator whenever that comparator senses a low voltage.

The supply current for the quad comparator 15 is supplied from the lead 20 through resistor 27 with the voltage supplied to the comparator being regulated by a zener diode 28.

The reference voltage circuit includes a pair of zener diodes 29, selected for low temperature coefficients, that are fed through a resistor 30 from the first voltage supply lead 20. A potentiometer 31 and resistor 32 are connected in series across the zener diodes 29. A parallel circuit leads from a slider 33 of the potentiometer 31 through a potentiometer 34, resistor 35, and transistor 36 to the return lead 13. A base 37 of the transistor 36 is connected to the junction between the transistor 23 and resistor 24. The voltage at slider 38 of potentiometer 34 is applied to the second inputs of the quad comparator and serves as the regulated reference voltage against which the output voltages of the full wave rectifiers are compared to detect a low line voltage.

When the monitor has been adjusted and is in operation the output circuits of the comparators are nonconducting (off) so that transistor 23 is biased "on" and current flows through the relay coil 21. This current flow through resistor 24 biases transistor 36 "on" so that current flows through potentiometer 34 thus bringing the slider thereof to its low or reference voltage that equals the selected fraction of a line voltage when that voltage is at its low limit. If a line voltage falls below its low limit the fraction of the rectified line voltage appearing at the junction of resistors 13 and 14 falls below the voltage on the potentiometer slider 38 (the reference voltage) and the comparator responds by drawing current away from the base 25 of transistor 23. This interrupts the current flow through the relay coil 21 and resistor 24 which in turn interrupts the current flow through transistor 36 and potentiometer 34. As a result the voltage on slider 38 (the reference voltage) is increased thus locking in the low voltage indication.

A preferred procedure for setting the potentiometers 31 and 34 is to first set the sliders of both potentiometers to the high voltage end, then with normal line voltages applied, turn slider 33 down until the circuit resets and the relay is energized to indicate normal voltage. Next the slider 38 is turned toward the low voltage end to lower the reference voltage to a value less than the low voltage limit, a line voltage is lowered to the low voltage limit, and then the slider 38 is slowly moved toward the high voltage end until the circuit trips and the relay is deenergized.

This circuit, with a minimum of components, provides a simple, accurate low voltage monitor that responds to the lowest of a plurality of voltages being monitored.

What is claimed is:

1. A multiphase undervoltage monitoring circuit comprising, in combination, a transformer and rectifier connected across each phase voltage to be monitored to give a direct current voltage proportional to the phase voltage, a regulated reference voltage source, a voltage comparator for each phase voltage to be monitored connected between the corresponding rectifier and the reference voltage, an output relay circuit connected to and responsive to the output of the comparators, and a connection between said output relay circuit and said reference voltage source arranged to vary said reference voltage in response to a change in the output of the comparators.

2. A multiphase undervoltage monitoring circuit according to claim 1 in which the reference voltage is increased in response to the sensing of an under-voltage on any phase voltage.

3. A multiphase undervoltage monitoring circuit according to claim 1 in which the reference voltage source includes a first potentiometer connected across a source of fixed voltage, a second potentiometer a resistor and a collector-emitter circuit of a transistor connected in series between a slider of the first potentiometer and a terminal of the fixed voltage source, a slider on the second potentiometer connected to the voltage comparators, a resistor connected between the base and emitter of the transistor, said resistor being included in the relay circuit that is responsive to the output of the comparators.

* * * * *